United States Patent [19]

Maruyama et al.

[11] Patent Number: 4,948,983
[45] Date of Patent: Aug. 14, 1990

[54] ALIGNMENT OF MASK AND SEMICONDUCTOR WAFER USING LINEAR FRESNEL ZONE PLATE

[75] Inventors: Shigeru Maruyama, Kawasaki; Shunsuke Fueki, Yokohama; Horonobu Kitajima, Yokohama; Takashi Kiuchi, Tsukuba, all of Japan

[73] Assignee: Fujitsu Limited, Kawasaki, Japan

[21] Appl. No.: 471,008

[22] Filed: Jan. 25, 1990

Related U.S. Application Data

[63] Continuation of Ser. No. 349,177, May 9, 1989, abandoned.

[30] Foreign Application Priority Data

May 13, 1987 [JP] Japan ............... 63-114767

[51] Int. Cl.$^5$ ............... G01N 21/86
[52] U.S. Cl. ............... 250/548; 356/401
[58] Field of Search ............... 250/548; 356/399, 400, 356/401, 363, 356

[56] References Cited

U.S. PATENT DOCUMENTS 4,704,033 11/1987 Fay et al. ............... 356/401
4,815,854 3/1989 Tanaka et al. ............... 356/401

FOREIGN PATENT DOCUMENTS

62-132320 6/1987 Japan.
63-244002 10/1988 Japan.

Primary Examiner—Davis L. Willis
Attorney, Agent, or Firm—Staas & Halsey

[57] ABSTRACT

A system for aligning a mask and a semiconductor wafer comprises radiation source for producing a radiation beam, a dual focus linear Fresnel zone plate provided on the mask for focusing the radiation beam incident thereto on a surface of the semiconductor wafer which comprises a first part having a first focal length and a second part having a second focal length substantially smaller than the first focal length, a diffraction grating provided on the surface of the semiconductor wafer in correspondence to the dual focus linear Fresnel zone plate for diffracting the radiation beam focused thereon, a detector held with a predetermined relationship with respect to the radiation source and the mask for detecting the diffracted beam, a movable stage for supporting the semiconductor wafer, and a controller for moving the stage means responsive to an output signal of the detection means.

11 Claims, 7 Drawing Sheets

ALIGNMENT OF MASK AND SEMICONDUCTOR WAFER USING LINEAR FRESNEL ZONE PLATE

This is a continuation of Ser. No. 349,077, filed May 9, 1989, now abandoned.

BACKGROUND OF THE INVENTION

The present invention relates in general to fabrication of semiconductor devices and in particular to a system used for achieving alignment between a mask carrying a semiconductor pattern and a semiconductor wafer by using a linear Fresnel zone plate.

Conventionally, there is a system for achieving proper alignment between a mask carrying a desired semiconductor pattern and a semiconductor wafer by using a circular Fresnel zone plate (Fay, B. and Novak, W. T., "Automatic X-Ray Alignment System for Submicron VLSI Lithography." Solid State Technology, May, 1985). The circular Fresnel zone plate works similarly to a convex lens and focuses a radiation such as light or X-ray passing therethrough at a predetermined focal length as a result of diffraction caused at the edge between alternating transparent and opaque concentric rings constituting the plate. In this prior art system, a pair of circular Fresnel zone plates are provided on the mask and another circular Fresnel zone plate is provided on the wafer. In operation, they are illuminated obliquely from a top so that the radiation is incident to the wafer after passing through the mask. The radiation thus incident to the wafer is then reflected and passed through the mask in the opposite direction. At the time of reflection by the wafer and at the time of passing through the mask in the second time, the radiation is focused by the circular Fresnel zone plates on the wafer and on the mask. When the mask and the wafer are properly aligned, the spot of the radiation thus focused by these circular Fresnel zone plates are aligned on a straight line. Therefore, one can determine the state of alignment of the mask to the wafer by observing the relation between these three spots thus formed by suitable means such as a CCD device or camera.

In this prior art system, however, there is a problem in that a large area on the mask and the wafer are occupied by the circular Fresnel zone plates. In fact, at least a pair of such set of Fresnel zones, each including the three circular Fresnel zone plates therein, two of which on the mask and one on the wafer, have to be used in order to achieve a two dimensional alignment of the wafer and the mask. As such a set of Fresnel zone plates have to be provided on each of the masks, the area occupied by the circular Fresnel zone plates is further increased when a number of such masks are used for the patterning as is usually practised in the actual patterning of the semiconductor devices.

Alternatively it is proposed to use a linear Fresnel zone plate in the system for aligning the wafer and the mask. In this system, the Fresnel zone plate referred to hereinafter as LFZP is provided on the mask so as to focus a parallel beam of the radiation such that the radiation passed through the mask is focused on the wafer as a line-shaped image similarly to the case of a cylindrical lens. The wafer on the other hand carries a diffraction grating which may be a row of projections or depressions extending along the line-shaped image. Such a grating diffracts the radiation to a predetermined direction when irradiated by the focused radiation through the LFZP.

Figure 1A:
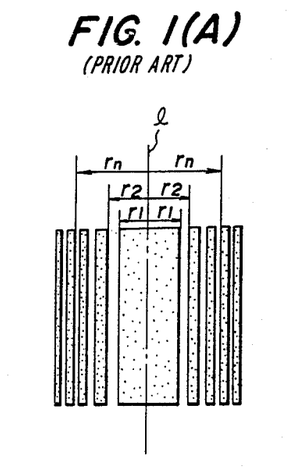
FIGS. 1(A) and (B) are a front view and a plan view showing a prior art linear Fresnel zone plate.
Figure 1B:
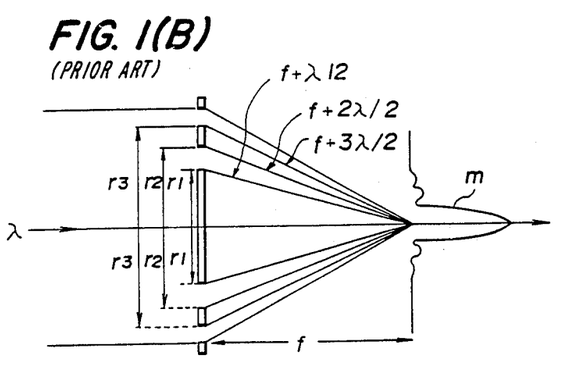

FIG. 1(A) shows a typical conventional LFZP comprising a plurality of alternating transparent and opaque bands arranged in one direction. Such a structure behaves similarly to the cylindrical lens as schematically illustrated in FIG. 1(B). The LFZP is symmetrical about its central line 1 and there holds a relation:

$$r_n^2 = nf\lambda + (n\Delta)^2/4$$
$$n = 1, 2 \tag{1}$$

where $r_n$ stands for a distance measured from the central line 1 to a boundary between an nth band which may be opaque or transparent and an (n+1)th band which may be transparent or opaque, f stands for the focal length, and $\lambda$ stands for the wavelength of the radiation.

As a result, there occurs an interference of the diffracted light in a focal plane which is separated from the LFZP by the distance f as schematically illustrated by an image m which represents the distribution of intensity of the diffracted radiation on the focal plane. When such a diffracted radiation is incident to a diffraction grating, there occurs a diffraction in a predetermined direction.

Figure 2:
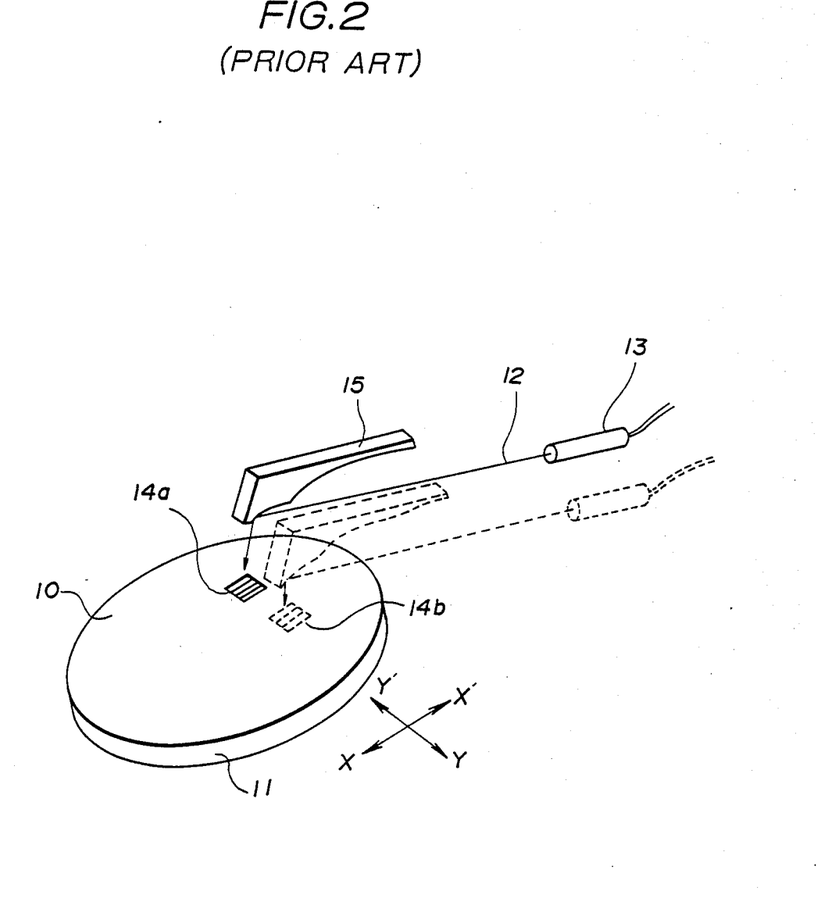
FIG. 2 is a perspective view schematically showing a prior art alignment system for aligning a mask and a wafer.

FIG. 2 is a diagram showing a conventional system used for aligning a mask 10 and a wafer 11. Referring to the drawing, a radiation 12 produced by a radiation source 13 is focused on a first LFZP 14a having a first focal length via a mirror 15. The wafer 11 is provided with a diffraction grating (not shown) and is transported horizontally while maintaining proper focusing until a strong diffraction is observed by a detector (not shown) held with a predetermined angular relation with respect to the source 13. As a result, a coarse alignment of the mask and wafer is achieved. Next, both of the radiation source 13 and the mirror 15 are moved horizontally to a position indicated by a broken line. In this state, the radiation falls on a second LFZP 14b having a second focal length which is substantially shorter than the first focal length. At the same time, the wafer 11 is raised such that the radiation diffracted by the second LFZP 14b is properly focused on the wafer 11. In correspondence to the LFZP 14b, there is provided a second grating (not shown) on the wafer 11 such that there appears a strong diffraction to a predetermined direction when the radiation correctly falls on the second grating. In order to detect the properly aligned position, the wafer is moved to and fro horizontally until the detector detects the diffraction from the second grating. By doing so, a precise alignment between the mask and wafer achieved In a typical example, the LFZP 14a has a focal length of 50 $\mu$m and the the LFZP 14b has a focal length of 10 $\mu$m.

In such a prior art construction, however, there is a problem in that one has to use at least two LFZPs in order to achieve the alignment in one direction such as X or Y (FIG. 2). In correspondence to this, two diffraction gratings must be provided on the surface of the wafer for each direction. As a plurality of masks are usually employed for the patterning in the actual semiconductor devices, the number of the LFZPs on the mask and the number of corresponding gratings on the wafer increases with a rate twice as large as the number of the masks. For example, ten LFZPs in total and ten corresponding gratings have to be provided on the mask and on the wafer when patterning a device comprising five semiconductor layers. Thus, substantial area on the wafer and the mask is occupied by the marks such as the the LFZP and the grating for the alignment.

Further, one has to move the radiation source and the associated optical system such as the mirror 15 horizontally each time the coarse alignment is completed. Associated with the movement, there arises a problem of achieving proper alignment between the thus moved optical system and the mask.

SUMMARY OF THE INVENTION

Accordingly, it is a general object of the present invention to provide a novel and useful system for aligning a mask and a wafer wherein the problems aforementioned are eliminated.

Another and more specific object of the present invention is to provide a system for aligning a mask and a wafer by using a linear Fresnel zone plate on the mask and a corresponding diffraction grating on the wafer, wherein the number of the linear Fresnel zone plate and the diffraction grating is reduced.

Another object of the present invention is to provide a system for aligning a mask and a wafer by using a dual focus linear Fresnel zone plate, wherein the linear Fresnel zone plate comprises a first part having a first focal length and a second part having a second focal length which is substantially smaller than the first focal length and formed inside the first part. According to the present invention, the same linear Fresnel zone plate can be used for coarse alignment and for precise alignment. As a result, one can eliminate the hitherto required shifting of optical system and a cooperating detector from a first position corresponding to a first linear Fresnel zone plate for coarse alignment to a second position corresponding to a second linear Fresnel zone plate for precise alignment. Further, the number of the linear Fresnel zone plate and corresponding grating to be provided on the mask and on the wafer is reduced to one half.

Other objects and further features of the present invention will become apparent from the following detained description when read in conjunction with attached drawings.

DETAILED DESCRIPTION

Figure 3:
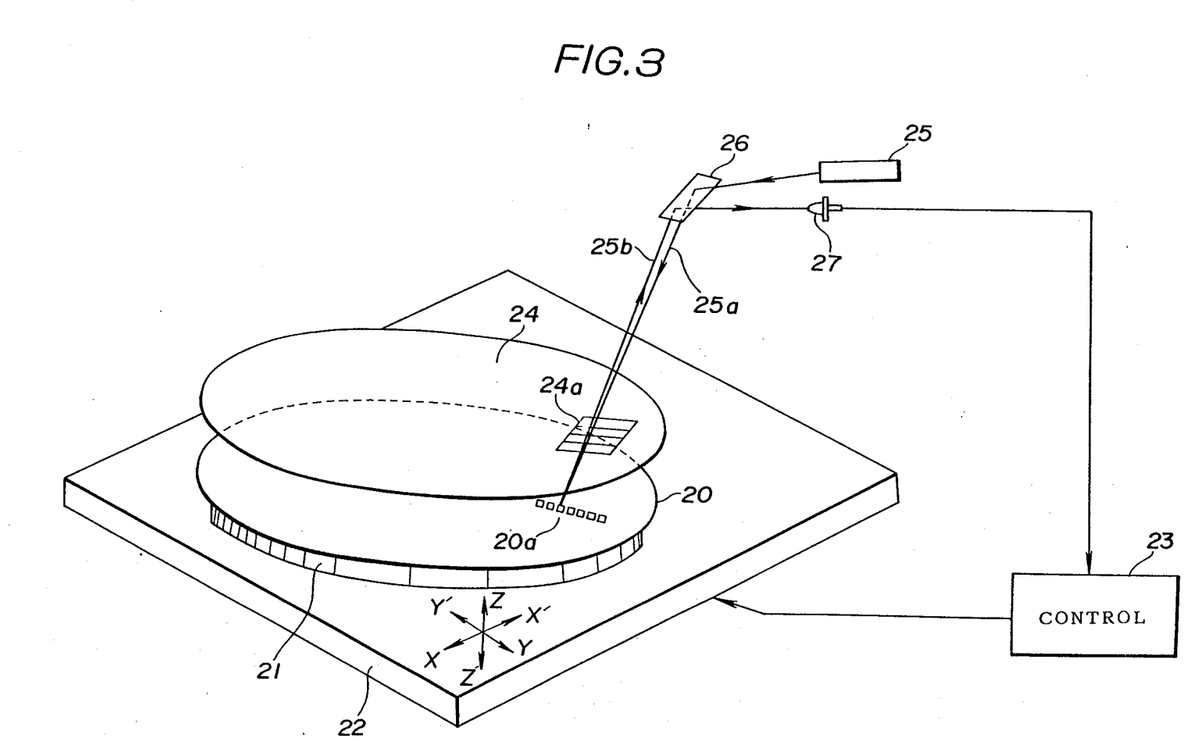
FIG. 3 is a perspective view showing an overall construction of the alignment system according to an embodiment of the present invention.

FIG. 3 shows an overall construction of the alignment system for achieving alignment between a mask and a wafer according to an embodiment of the present invention. It should be noted that the term "mask" used herein means a medium carrying a desired semiconductor pattern to be transferred to the wafer and includes those used for photolithography wherein the pattern is transferred to the wafer by optical irradiation, those used for X-ray lithography wherein the pattern in transferred to the wafer by X-ray irradiation or those used for projection of the pattern by any known radiation beam.

Referring to FIG. 3, a semiconductor wafer 20 is held by a wafer chuck 21 which in turn is mounted on a stage 22. The stage 22 is moved in X-X' direction, Y-Y' direction and Z-Z' direction as indicated in the drawing by a controller 23. Over the wafer 20, there is positioned a mask 24 which carries a semiconductor pattern (not shown) to be transferred to the wafer 20. When the wafer 20 is moved together with the stage 22 by the controller 23, the relative position between the wafer 20 and the mask 24 is changed. In order to achieve a proper alignment between the mask 24 and the wafer 20, the mask is formed with a dual focus LFZP 24a to be described later. Further, the wafer 20 is formed with a diffraction grating 20a which may be a row of projections or depressions extending in a predetermined direction. The LFZP comprises a plurality of parallel bands or stripes and the grating 20a extends parallel to the direction of the individual bands. The LFZP 24a is illuminated by a laser 25 for producing a laser beam 25a which is coherent and incident to the LFZP 24 a along a suitable optical path including optical element such as a mirror 26. When the laser beam 25a is incident to the LFZP 24a, the LFZP 24a works similarly to a cylindrical lens and focuses the laser beam on the wafer 20 in a form of a linear image extending along the grating 20a. In order to achieve a proper focusing of the laser beam 25a on the wafer 20, the controller 23 moves the wafer 20 up and down if necessary as will be described. The laser beam 25a incident to the LFZP a predetermined direction as a diffraction beam 25b, and the diffraction beam 25b thus produced is detected by a photodiode 27. The photodiode 27 produces an output signal proportional to the intensity of the diffraction beam 25b and the controller 13 moves the stage in the X-Y plane responsive to the output signal until a strong diffraction beam 25b is detected by the photodiode 27.

Figure 4A:
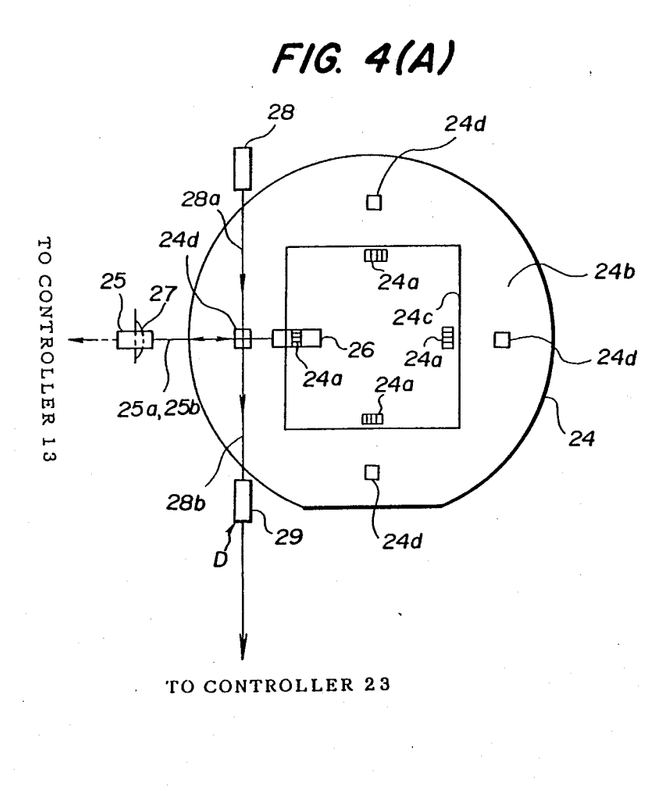
FIGS. 4(A) and (B) are plan view and perspective view showing a part of the system of FIG. 3 in detail.
Figure 4B:
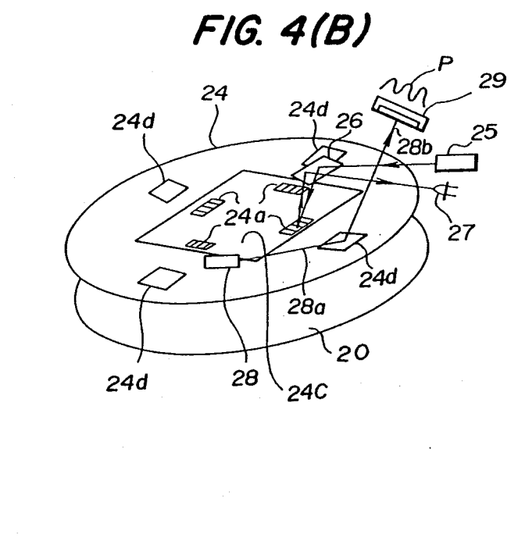

FIGS. 4(A) and (B) show the arrangement for focusing of the laser beam 25a on the dual focus LFZP 24a. Referring to the drawings, the mask 24 is uniformly coated with an absorbent 24b except for a patterning region 24c formed with a semiconductor pattern (not shown). Further, one or more transparent windows 24d are formed in the absorbent 24b located outside of the patterning region 24c. Further, another laser 28 produces a laser beam 28a which is incident on the wafer 20 through the transparent window 24d. The incident laser beam 28a is partially reflected by the surface of the mask 24 and partially transmitted. This transmitted beam causes multiple reflections between the mask 24 and the wafer 20. These reflected beams interfere and there is formed an interference pattern P as shown in FIG. 4(B). This interference pattern takes a form of a periodical stripe having a wave length which is inversely proportional to a distance between the wafer 20 and the mask 24. The interference pattern is detected by a charge-coupled device (CCD) 29 which produces an output signal carrying information about the distance between the wafer 20 and the mask 24. This output signal of the CCD 29 is supplied to the controller 23 for analysis, and the controller moves the wafer 20 up or down responsive to the output signal of the CCD 29 by driving the stage 22 in the Z-Z' direction.

In the illustrated example, the optical path for the optical beams 28a and 28b intersects with the optical path for the optical beams 25a and 25b in the plan view as illustrated in FIG. 4(A). Actually, the optical beams 28a and 28b pass below the beams 25a and 25b as shown in the perspective view of FIG. 4(B). In order to achieve the alignment of the wafer in the X-Y plane, there are provided a plurality of the dual focus LFZPs 24b and corresponding gratings 20a. In the example of the drawing, there are provided four sets of the LFZPs and gratings. Further, there are provided four transparent windows 24d for focusing of the beam 25a on the LFZP 24a on the mask 24. In each of the set of the LFZPs, the alignment of the wafer to the mask in the X-Y plane is performed as already described. In the system of the present invention, lateral shifting of the laser and cooperating optical system hitherto necessary when switching from the coarse alignment to the precise alignment can be eliminated by using a single LFZP.

Next, a first embodiment of the dual focus LFZP 24a used in the system of FIG. 3 will be described with reference to FIG. 5(A).

Referring to the drawing, the dual focus LFZP 24a comprises a first LFZP part I having a first focal length f1 and a second LFZP part II having a second focal length f2. The first LFZP I has an opaque central zone C similar to the LFZP of FIG. 1(A), and the second LFZP II having a transparent central zone D is formed in this central zone C. In other words, the central zone C of the first LFZP-I would be totally opaque when the second LFZP II is not formed therein. Each of the first and second LFZP parts comprises a plurality of alternating transparent and opaque bands 1 and 2 extending parallel to each other and disposed symmetrically about a central line l of the central zone C. In other words, the bands 2 for the LFZP part II are located centrally relative to bands 1 for the LFZP part I. In the illustrated example, the number of the bands for the LFZP parts I and II is chosen to be seven. It should be noted that the second LFZP II need not necessarily be formed in the central zone C but may be formed in a zone E of the first LFZP I shown in FIG. 5(A) with substantially a same result.

The dimension of the bands for the LFZP part I and II is determined by Eq.(1). Thus, in the case where it is assumed that the wave length $\lambda$ of the used radiation is 780 nm and that the first and second focal lengths f1 and f2 are assumed to be 80 $\mu$m and 10 $\mu$m respectively, the distance from the central line l of the dual LFZP 24a to a boundary between a transparent band and an adjacent opaque band is calculated as follows:

TABLE I

Figure 5A:
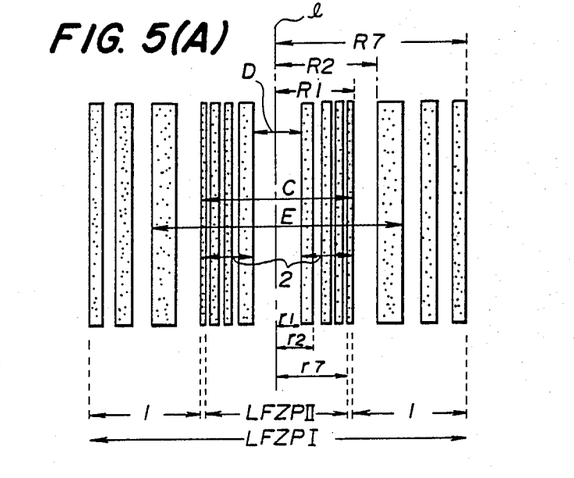
FIGS. 5(A) and (B) are front views showing first embodiment dual focus linear Fresnel zone plate used in the system of FIG. 3 and its modification.

| n | rn | Rn |
|---|-----|------|
| 1 | 2.8 | 7.9 |
| 2 | 4.0 | 11.2 |
| 3 | 5.0 | 13.7 |
| 4 | 5.8 | 15.9 |
| 5 | 6.5 | 17.8 |
| 6 | 7.2 | 19.5 |
| 7 | 7.9 | 21.1 | where $r_n$ and $R_n$ are defined in FIG. 5(A) and represent the distance represented in microns from the center of the dual LFZP 24a to the boundary between an nth band and an (n+1)th band in the first LFZP I and in the second LFZP II, respectively.

As already noted, the first LFZP part I has the opaque central zone C in which the second LFZP part II is not formed. In such a construction, the intensity of the radiation focused by the first LFZP part I. remains the same as in the case in which there is no second LFZP part II in the central zone C.

Figure 5B:
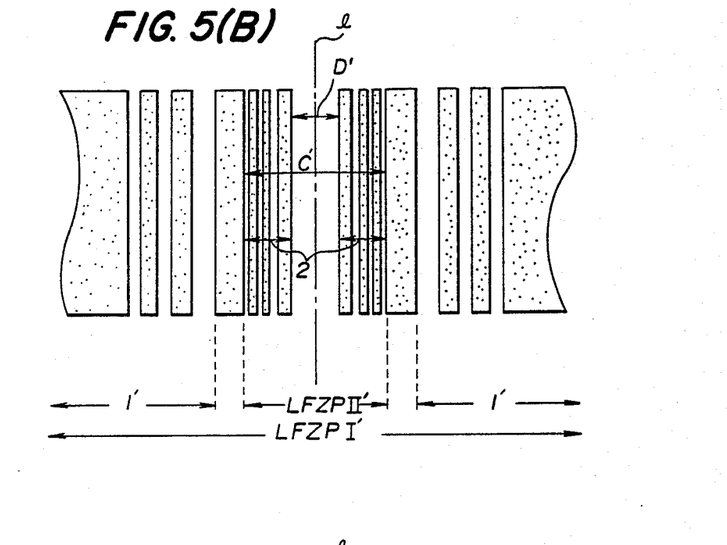

FIG. 5(B) shows a modification of the dual focus LFZP of FIG. 5(A) in which the second LFZP part II having the transparent central zone D' is provided in a transparent central zone C' of the first LFZP I' having bands 1' of which transparency is reversed relative to bands 1 (i.e., of FIG. 5A). In this case there occurs a decrease in the intensity of radiation focused by the first LFZP part I' because of the existence of the second LFZP II' in the central zone C' which would otherwise be transparent.

Figure 6:
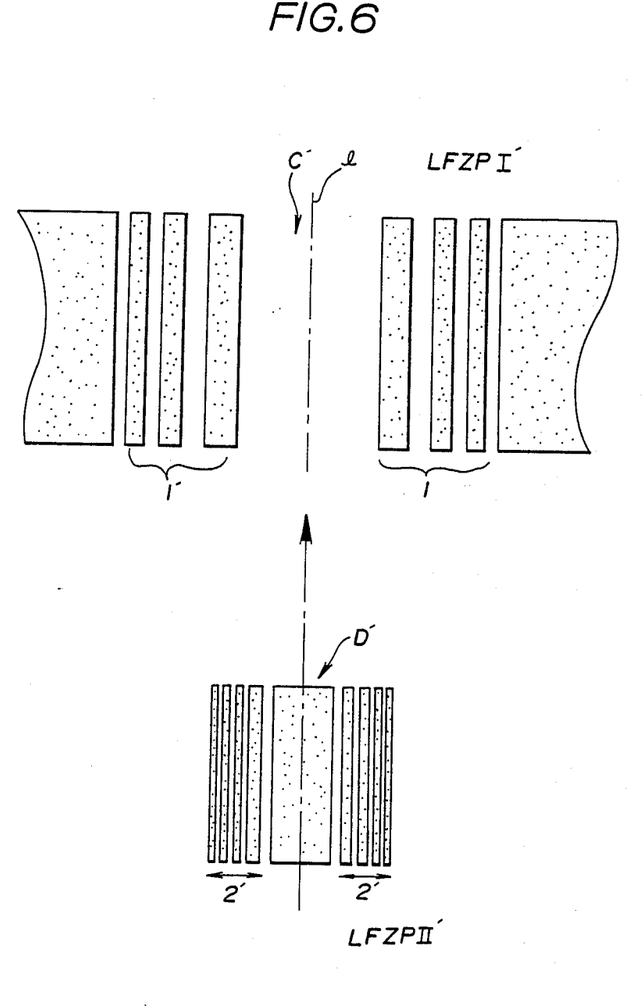
FIG. 6 is a diagram similar to FIGS. 5(A) and (B) showing another embodiment of the dual focus linear Fresnel zone plate.

FIG. 6 shows a second embodiment of the dual focus LFZP used in the system of FIG. 3. In this embodiment, the central band C' is transparent and a second LFZP part II' having an opaque central zone D' and bands 2' of which transparency is similarly reversed is formed in this transparent zone C'. In order to facilitate the understanding, the LFZP part I' and LFZP part II' are drawn separately. In this embodiment, the intensity of the radiation focused by the LFZP part I' is reduced to about one half as compared to the case in which there is no second LFZP part II' provided in the central zone C'. Such a decrease in the intensity of the focused radiation causes no substantial problem in the coarse alignment of the wafer when used in the system of FIG. 3.

Further, the first LFZP to be combined with the second LFZP II' having the opaque central zone D' is not limited to those illustrated in FIG. 6 having a transparent central band but may be those having an opaque central band C. It should be noted that the LFZP works generally identically even if the transparency of the opaque band and transparent band is reversed.

Figure 7:
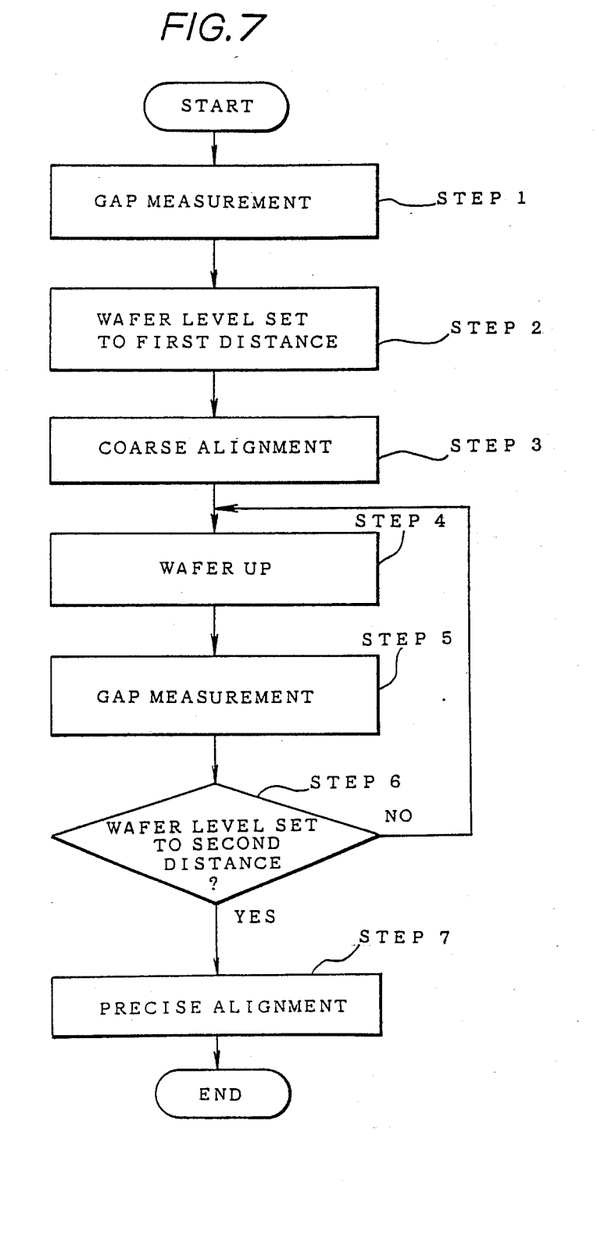
FIG. 7 is a flowchart showing the steps of aligning the mask and the wafer by the system of FIG. 3.

FIG. 7 shows the procedure for achieving the alignment by the system of FIG. 3.

In a step 1, the distance between the wafer 20 and the mask 24 is determined by the CCD device 29 of FIGS. 4(A) and (B). Next, the stage 22 is moved up or down by the controller 23 in a step 2 so that the distance between the mask 24 and the wafer 20 is set to the focal length of the first LFZP part I of the dual focus LFZP 24a. In a step 3, the stage 22 is moved in the X-X' and Y-Y' directions by the controller 23 until a strong diffraction is detected by the detector 27. Next, the stage 22 is moved further upwards in a step 4 while measuring the distance between the wafer 20 and the mask 24 in a step 5 until the distance is correctly set to the focal length of the second LFZP II part in a step 6. Then, the stage 22 is moved in the X-X' and Y-Y' directions until the strong diffraction is detected by the detector 27.

According to this procedure, one can achieve a precise alignment between the wafer and the mask while using a single LFZP and without shifting the position of the detector and optical system cooperating thereto at the time of switching from the coarse alignment to the precise alignment.

Further, the present invention is not limited to these embodiments but various variations and modifications may be made without departing from the scope of the present invention.

What is claimed is:

1. A system for aligning a mask carrying a pattern to be transferred to a semiconductor wafer to be patterned, said mask being positioned above the semiconductor wafer, comprising:

radiation source means for producing a radiation beam and for guiding the radiation beam thus produced so that the radiation beam irradiates the wafer through the mask located thereabove;

focusing means provided on the mask for focusing the radiation beam incident thereto on a surface of the semiconductor wafer, said focusing means comprising first linear Fresnel zone part having a first focal length which in turn comprises a central zone and a plurality of parallel and alternating opaque and transparent bands disposed symmetrically about a central axis passing through the central zone and a second linear Fresnel zone part having a second focal length substantially smaller than the first focal length, said second linear Fresnel zone part being provided in said first linear Fresnel zone part and comprising a plurality of parallel and alternating opaque and transparent bands disposed symmetrically with respect to a symmetrical axis;

diffraction means provided on the surface of the semiconductor wafer in correspondence to the focusing means for diffracting the radiation beam focused thereon in a form of a diffracted beam traveling in a predetermined direction relative to the wafer;

detection means held with a predetermined relationship with respect to the radiation source means and the mask for detecting the diffracted beam, said detection means further producing an output signal having a level proportional to the intensity of the diffracted beam;

stage means for supporting the semiconductor wafer movably in a plane parallel to the surface of the wafer; and a controller for moving the stage means responsive to the output signal of the detection means.

2. A system as claimed in claim 1 in which said central axis of the first linear Fresnel zone part and the symmetrical axis of the second linear Fresnel zone part coincide each other.

3. A system as claimed in claim 1 in which said diffraction means comprises a diffraction grating which in turn comprises a single row of projections provided on the surface of said semiconductor wafer in a direction generally parallel to the direction of the individual bands of the focusing means.

4. A system as claimed in claim 1 in which said radiation beam comprises a coherent optical beam and said radiation source means comprises a laser for producing the coherent optical beam.

5. A system as claimed in claim 1 in which said stage means further supports the wafer movably in a direction perpendicular to the surface of the wafer, the system further comprises means for measuring the distance between said mask and the wafer and for producing a second output signal indicating the measured distance, and the controller controls the movement of the stage means in the direction perpendicular to the plane of the wafer responsive to the second output signal.

6. A system as claimed in claim 5 in which said means for measuring the distance further comprises means for producing a second coherent radiation beam to be irradiated on the surface of the wafer, a transparent window defined in the mask for passing the second coherent radiation beam to the surface of the wafer, and means for detecting an interference stripe formed as a result of an interference between the incident second coherent radiation beam and a plurality of reflected beams produced as a result of multiple reflections of the incident second coherent radiation beam between the the wafer and the mask, said means for detection produces the second output signal.

7. A method of aligning a mask carrying a semiconductor pattern to a semiconductor wafer to be patterned according to the semiconductor pattern on the mask by using a dual focus linear Fresnel zone plate having a first focal length and a second focal length which is substantially shorter than the first focal length, comprising steps of:

focusing a radiation beam from a radiation source held with a predetermined positional relationship with respect to the mask, on a surface of the wafer through the dual focus linear Fresnel zone plate by setting the distance between the mask and the wafer to the first focal length;

moving the wafer relative to the mask in a plane parallel to the mask while observing a diffraction beam diffracted from a diffraction grating provided on the surface of the wafer in response to irradiation of the diffraction grating by the radiation beam focused at the first focal length by a detector held with a predetermined positional relationship with respect to the radiation source and the mask until a predetermined intensity of the diffraction beam is observed;

moving the wafer towards the mask so that the distance between the mask and the wafer is set to the second focal length of the dual focus linear Fresnel zone plate while maintaining the predetermined positional relationship between the radiation source, detector and the mask; and moving the wafer relative to the mask in a plane parallel to the mask while observing the diffraction beam which is diffracted from the diffraction grating in response to irradiation of the diffraction grating by the radiation beam focused at the second focal length by the detector held with the same predetermined positional relationship with respect to the radiation source and the mask until the predetermined intensity of the diffraction beam is observed.

8. A method as claimed in claim 7 in which said diffraction grating on the surface of the wafer is used in common for diffracting the incident radiation beam in a case in which the radiation beam is focused thereon by the dual focus Fresnel zone plate with the first focal length and in a case in which the radiation beam is focused thereon with the second focal length.

9. A method for optically aligning a mask carrying a pattern to be transferred to a semiconductor wafer to be patterned, the mask and wafer respectively having parallel planar surfaces and being selectively positioned in adjustable, closely spaced parallel relationship so as to define an adjustable gap therebetween, comprising:

providing at least one dual and integrated, linear Fresnel zone plate on the mask, each said zone plate including a first linear Fresnel zone part having a first focal length which in turn comprises a central zone and a plurality of parallel and alternating opaque and transparent bands disposed symmetrically about a central axis passing through the central zone and a second linear Fresnel zone part having a second focal length substantially smaller than the first focal length, said second linear Fresnel zone part being provided in said first linear Fresnel zone part and comprising a plurality of parallel and alternating opaque and transparent bands disposed symmetrically with respect to a symmetrical axis;

providing a diffraction grating on the surface of the semiconductor wafer in correspondence to and for each said dual linear Fresnel zone plate, for diffracting a radiation beam focused thereon by the corresponding said zone plate and forming a diffracted beam traveling in a predetermined direction relative to the wafer;

moving the wafer relative to the mask in a first direction normal to the respective planar surfaces thereof to adjust the gap therebetween to a first distance value corresponding to the first focal length of the first linear Fresnel zone part;

moving the wafer relative to the mask selectively in second, orthogonal directions respectively perpendicular to the first direction, while directing a focused radiation beam onto the linear Fresnel zone plate for focusing same therethrough onto the corresponding diffraction grating on the semiconductor wafer and detecting the diffracted beam formed thereby and travelling in said predetermined direction for determining an optimum intensity of the detected, diffracted beam and thereby establishing a coarse alignment of the wafer and mask in the orthogonal, second directions;

maintaining the coarsely aligned, relative positions of the wafer and mask in the orthogonal, second directions and moving the wafer relative to the mask in the first direction to adjust the gap therebetween to a second distance value corresponding to the second focal length of the second linear Fresnel zone part; and maintaining the relative positions of the wafer and mask at the second distance value of the gap therebetween and moving the wafer relative to the mask in the mask direction while directing the focused radiation beam onto the linear Fresnel zone plate and focusing same there through onto the corresponding diffracting grating on the semiconductor wafer and detecting the diffracted beam formed thereby and traveling in said predetermined direction for determining an optimum intensity of the detected, diffracted beam and thereby establishing precise alignment of the wafer and mask in the orthogonal, second directions.

10. The method of claim 9, wherein the step of adjusting the relative gap spacing in the first direction respectively to the first and second focal length distances further comprises:

providing a transparent window in the mask, aligned with and respectively corresponding to each said linear Fresnel zone plate;

transmitting a radiation beam in an optical path extending through the transparent window in the mask and for partial reflection by the surface of the mask, including undergoing multiple reflections between the mask and the wafer, thereby to produce interfering reflected beams reflected from the surface of the mask and passing in a second optical path in the opposite direction through the transparent window; and analyzing the interference pattern of the reflected beams for determining a distance measurement of the spacing between the mask and the wafer, and continuing to make said distance measurement determination while moving the mask relatively to the wafer in the mask first direction thereby for adjusting the gap spacing respectively to each of the first and second focal lengths.

11. The method of claim 9, further comprising:

providing four dual, linear Fresnel zone plates on the mask at positions aligned with the second, orthogonal directions and symmetrically disposed relative to the first direction;

performing the coarse alignment of the mask and wafer for each of the four dual, linear Fresnel zone plates at the first gap distance value; and performing the precise alignment of the mask and wafer at the second gap distance value for each of the four dual, linear Fresnel zone plates.

* * * * *

UNITED STATES PATENT AND TRADEMARK OFFICE
CERTIFICATE OF CORRECTION

PATENT NO. : 4,948,983
DATED : Aug. 14, 1990
INVENTOR(S) : MARUYAMA et al.

It is certified that error appears in the above-identified patent and that said Letters Patent is hereby corrected as shown below:

ON TITLE PAGE:

[75] Inventors: change "Horonobu Kitajima" (third inventor) to --Hironobu Kitajima--;

[63] Related U.S. Application Data: change "349,177" to --349,077--;

[30] Foreign Application Priority Data: change "1987" to --1988--.

\*   Col. 1,   line 46, change "zones" to --zone plates--.

Col. 2,   line 8 (equation (1)), change "$(n\Delta)$" to --$(n\lambda)$--;

line 51, after "achieved" insert --.--.

\*   Col. 4,   line 50, delete "a".

Col. 5,   line 33, change "LFZP-I" to --LFZP I--;
            line 38, change "line 1" to --line $\ell$--;
            line 52, change "line 1" to --line $\ell$--.

Col. 6,   line 6, delete ".";
            line 10, change "part II" to --part II'--.

\*   Col. 8,   line 5, after "between" delete "the".

UNITED STATES PATENT AND TRADEMARK OFFICE
CERTIFICATE OF CORRECTION

PATENT NO. : 4,948,983

DATED : Aug. 14, 1990

INVENTOR(S) : MARUYAMA et al.

It is certified that error appears in the above-identified patent and that said Letters Patent is hereby corrected as shown below:

Col. 9, line 41, change "mask" to --first--;
line 43, change "there through" to --therethrough--.

Col. 10, line 1, change "diffracting" to --diffraction--.

Signed and Sealed this

Second Day of June, 1992

Attest:

DOUGLAS B. COMER

Attesting Officer

Acting Commissioner of Patents and Trademarks